United States Patent
Choi

(10) Patent No.: US 7,902,632 B2
(45) Date of Patent: Mar. 8, 2011

(54) PUMPING MOS CAPACITOR

(75) Inventor: Jun-Ki Choi, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 16 days.

(21) Appl. No.: 12/327,559

(22) Filed: Dec. 3, 2008

(65) Prior Publication Data

US 2009/0321802 A1    Dec. 31, 2009

(30) Foreign Application Priority Data

Jun. 30, 2008   (KR) .................. 10-2008-0063170

(51) Int. Cl.
*H01L 29/00* (2006.01)
(52) U.S. Cl. .......... 257/532; 257/516; 438/239; 438/240
(58) Field of Classification Search .................. 257/516, 257/532, E29.342; 438/238–240
See application file for complete search history.

(56) References Cited

U.S. PATENT DOCUMENTS 7,485,911 B2 * 2/2009 Kim et al. ............ 257/303
2003/0218213 A1 * 11/2003 Ipposhi et al. ............ 257/350

FOREIGN PATENT DOCUMENTS

| KR | 100175007 B1 | 11/1998 |
| KR | 1020010004576 | 1/2001 |
| KR | 1020050071913 | 7/2005 |

OTHER PUBLICATIONS

Notice of Preliminary Rejection issued from Korean Intellectual Property Office on Mar. 31, 2010.
Notice of Allowance issued from Korean Intellectual Property Office on Oct. 28, 2010.

* cited by examiner

*Primary Examiner* — Theresa T Doan
(74) *Attorney, Agent, or Firm* — IP & T Group LLP

(57) ABSTRACT

A pumping MOS capacitor includes a substrate which is conductive and includes an irregular surface, a dielectric film formed along the irregular surface of the substrate and a gate formed on the dielectric film.

6 Claims, 3 Drawing Sheets

PUMPING MOS CAPACITOR

CROSS-REFERENCE TO RELATED APPLICATIONS

The present invention claims priority from Korean patent application number 10-2008-0063170, filed on Jun. 30, 2008, which is incorporated by reference in its entirety.

BACKGROUND OF THE INVENTION

The invention relates to a design technology of semiconductor devices, and more particularly, to a pumping MOS (Metal Oxide Semiconductor) capacitor for pumping and decompression.

In general, a semiconductor memory device includes an internal voltage generation circuit for more efficient power use, in which internal voltages with various levels are generated. Examples of such internal voltages include a core voltage VCORE, a peripheral voltage VPERI, a pumping voltage VPP, a substrate bias voltage VBB, and so on, which are derived from a power supply voltage VDD provided from the outside and a ground voltage VSS.

Recently, as the level of each of the power supply voltage VDD and the ground voltage VSS decreases, there is a problem that the pumping voltage VPP derived from the power supply voltage VDD and the substrate bias voltage VBB derived from the ground voltage VSS become lower or higher than their respective target levels. This is because the pumping or decompressing capability of circuits for generating the pumping voltage VPP and the substrate bias voltage VBB was lowered.

As drawings to explain the above, FIG. 1 is a general pumping voltage VPP generation circuit and FIG. 2 is a general substrate bias voltage VBB generation circuit. Since these circuits are well-known in the art, the operation explanation thereof is omitted here.

Referring to FIGS. 1 and 2, it can be seen that each of the pumping voltage VPP generation circuit and the substrate bias voltage VBB generation circuit includes a plurality of pumping MOS capacitors CAP. Each of these circuits generates a pumping voltage VPP and a substrate bias voltage VBB by pumping or decompression through the pumping MOS capacitors CAP. In the following description, the pumping MOS capacitors CAP will be simply referred to as a "capacitor".

FIG. 3 is a cross-sectional view of a capacitor CAP used for each of the pumping voltage VPP generation circuit and the substrate bias voltage VBB generation circuit.

Referring to FIG. 3, the capacitor CAP is manufactured in a MOS form, and includes a substrate 11 on which an N well is formed, a dielectric film 12 formed on the substrate 11, a gate 13 formed on the dielectric film 12, and an N-type source and drain 14 (also called a pick up well) formed on both sides of the gate 13 on the substrate. Here, the gate 13 corresponds to one side electrode of the capacitor CAP, and the N well and the N-type source and drain 14 correspond to the other side electrode thereof.

When the level of each of the power supply voltage VDD and the ground voltage VSS decrease as noted above, the pumping voltage VPP generation circuit or the substrate bias voltage VBB generation circuit increases an electrode area of the capacitor CAP, thereby improving pumping or decompressing capability.

As a result, the area occupied by the capacitor CAP within the generation circuit is increased, which means an increase in a chip size. Thus, the number of net dies that can be produced per wafer is decreased, thereby increasing manufacturing costs.

Therefore, there is a need for a technology capable of improving pumping or decompression capability of the pumping voltage VPP generation circuit or the substrate bias voltage VBB generation circuit by increasing capacitance of the capacitor CAP, without an increase in a chip size.

SUMMARY OF THE INVENTION

Embodiments of the invention are directed to providing a pumping MOS capacitor capable of improving capacitance, without increasing an area occupied by a capacitor within a chip.

In accordance with the invention, there is provided a pumping MOS capacitor comprising a substrate, a dielectric film formed along an irregular surface of the substrate and a gate formed on the dielectric film. The irregular surface may include stepped portions forming any one or any combination of recess patterns, bulb patterns, fin patterns, and saddle patterns, to thereby have a corrugated surface. The substrate may be conductive.

The invention is characterized by increased capacitance, without a variation in an area of a capacitor provided for pumping or decompression.

To this end, the invention irregularly forms a surface of a substrate serving as one side electrode and then forms a gate thereon as another side electrode. By doing so, the electrode area can be increased, without an increase in an area of a capacitor within a chip.

DESCRIPTION OF SPECIFIC EMBODIMENTS

Hereinafter, preferred embodiments in accordance with the invention will be described in detail with reference to the accompanying drawings so that the invention can readily be practiced by those skilled in the art to which the invention pertains.

Figure 4:
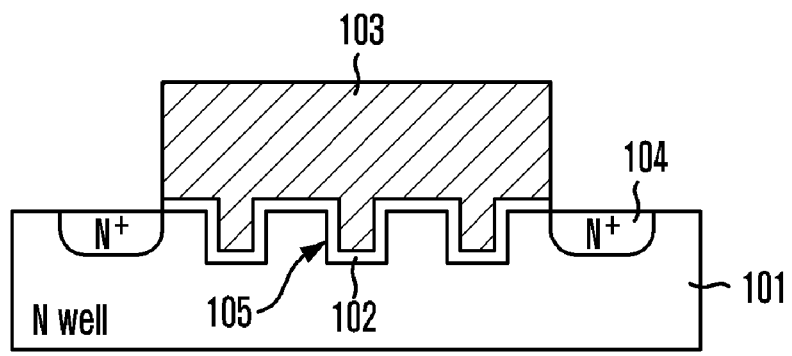
FIG. 4 is a cross-sectional view showing the structure of a capacitor manufactured in accordance with a first embodiment of the invention.

FIG. 4 is a cross-sectional view showing the structure of a capacitor manufactured in accordance with a first embodiment of the invention.

Referring to FIG. 4, the capacitor of this embodiment includes a substrate 101 on which plural recess patterns 105 are formed and an N well is formed, a dielectric film 102 (also referred to as a gate insulating film because the capacitor is an MOS type capacitor) formed on the substrate 101, a gate 103 formed on the dielectric film 102, and an N-type source and drain 104 formed on both sides of the gate 103 on the substrate 101. Here, the gate 103 corresponds to one side electrode of the capacitor and the N well and the N-type source and drain 104 correspond to the other side electrode thereof.

Details of each of the elements will be given below.

The N well and the N-type source and drain 104 may be formed by doping N-type impurities, e.g., phosphorus (P) on the substrate 101, such that the substrate 101 is conductive.

The gate 103 may be formed by a conductive film, e.g., polycrystalline silicon film or metal film containing impurities.

The dielectric film 102 may be formed by a high dielectric thin-film, such as $Al_2O_3$ or $HfO_2$.

The plural recess patterns 105 may be formed by anisotropic etching of the substrate 101 with a mask pattern having plural open regions.

The capacitor of the first embodiment has the plural recess patterns 105 formed on the substrate 101 to form irregular patterns including stepped portions on the substrate 101, thus increasing an area of a capacitor electrode. In particular, only the area of the capacitor electrode is increased, without an increase in an area of the capacitor within a chip, thereby increasing capacitance compared to the prior art.

Meanwhile, the substrate 101 may be conductive due to doping with N type impurities (meaning the N well and the N-type source and drain 104). However, this is only one example, and the substrate 101 may also be conductive due to doping with P type impurities, e.g., boron (B) to form a P well and a P type source and drain.

Figure 5:
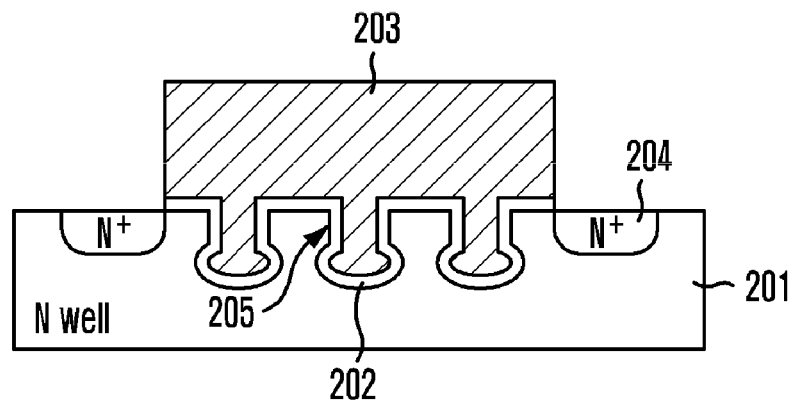
FIG. 5 is a cross-sectional view showing the structure of a capacitor manufactured in accordance with a second embodiment of the invention.

FIG. 5 is a cross-sectional view showing the structure of a capacitor manufactured in accordance with a second embodiment of the invention.

Referring to FIG. 5, the capacitor of this embodiment includes a substrate 201 on which plural bulb patterns 205 are formed and an N well is formed, a dielectric film 202 formed on the substrate 201, a gate 203 formed on the dielectric film 202, and an N-type source and drain 204 formed on both sides of the gate 103 on the substrate 201. Here, the gate 203 corresponds to one side electrode of the capacitor and the N well and the N-type source and drain 204 correspond to the other side electrode thereof.

Details of each of the elements will be provided below.

The N well and the N-type source and drain 204 may be formed by doping N-type impurities, e.g., phosphorus (P) on the substrate 201, such that the substrate 101 is conductive.

The gate 203 may be formed by a conductive film, e.g., polycrystalline silicon film or metal film containing impurities.

The dielectric film 202 may be formed by a high dielectric thin-film, such as $Al_2O_3$ or $HfO_2$.

The plural bulb patterns 205 may be formed to be wider in the bottom than in the inlet by anisotropic etching of the substrate 101 with a mask pattern having plural open regions to form recess patterns, followed by isotropic etching of lower portions of the recess patterns.

The capacitor of the second embodiment has the plural bulb patterns 205 formed on the substrate 201 to form irregular patterns including stepped portions on the substrate 201, thus increasing an area of a capacitor electrode. In particular, only the area of the capacitor electrode is increased, without an increase in an area of the capacitor within a chip, thereby increasing capacitance compared to the prior art.

Meanwhile, the substrate 201 may be conductive due to doping with N-type impurities (meaning the N well and the N-type source and drain 204). However, this is only one example, and the substrate 101 may also be conductive due to doping with P type impurities, e.g., boron (B) to form a P well and P type source and drain.

Figure 6:
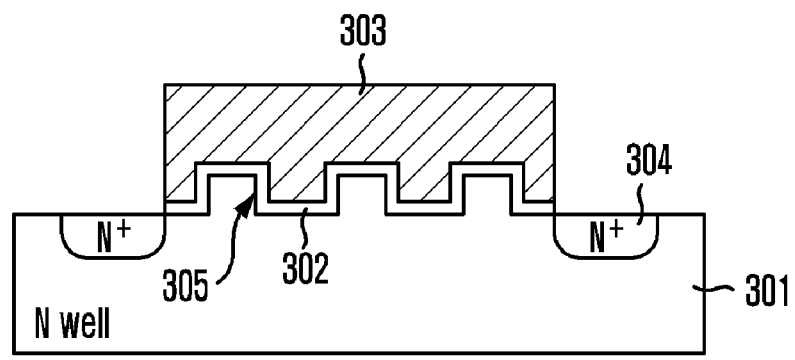
FIG. 6 is a cross-sectional view showing the structure of a capacitor manufactured in accordance with a third embodiment of the invention.

FIG. 6 is a cross-sectional view showing the structure of a capacitor manufactured in accordance with a third embodiment of the invention.

Referring to FIG. 6, the capacitor of this embodiment includes a substrate 301 on which plural fin patterns 305 are formed and an N well is formed, a dielectric film 302 formed on the substrate 301, a gate 303 formed on the dielectric film 302, and an N-type source and drain 304 formed on both side of the gate 303 on the substrate 301. Here, the gate 303 corresponds to one side electrode of the capacitor and the N well and the N-type source and drain 304 correspond to the other side electrode thereof.

Details of each of the elements will be presented below.

The N well and the N-type source and drain 304 are formed by doping N-type impurities, e.g., phosphorus (P) on the substrate 301, such that the substrate 301 is conductive.

The gate 303 is formed by a conductive film, e.g., polycrystalline silicon film or metal film containing impurities.

The dielectric film 302 is formed by a high dielectric thin-film, such as $Al_2O_3$ or $HfO_2$.

The plural fin patterns 305 are formed to protrude from the surface of the substrate 301 by performing a growth or deposition process on the substrate 301.

The capacitor of the third embodiment has the plural fin patterns 305 formed on the substrate 301 to form irregular patterns including stepped portions on the substrate 301, thus increasing an area of a capacitor electrode. In particular, only the area of the capacitor electrode is increased, without an increase in an area of the capacitor within a chip, thereby increasing capacitance compared to the prior art.

Meanwhile, the substrate 301 may be conductive due to doping with N-type impurities (meaning the N well and the N-type source and drain 304). However, this is only one example, and the substrate 301 may also be conductive due to doping with P type impurities, e.g., boron (B) to form a P well and a P type source and drain.

Figure 1:
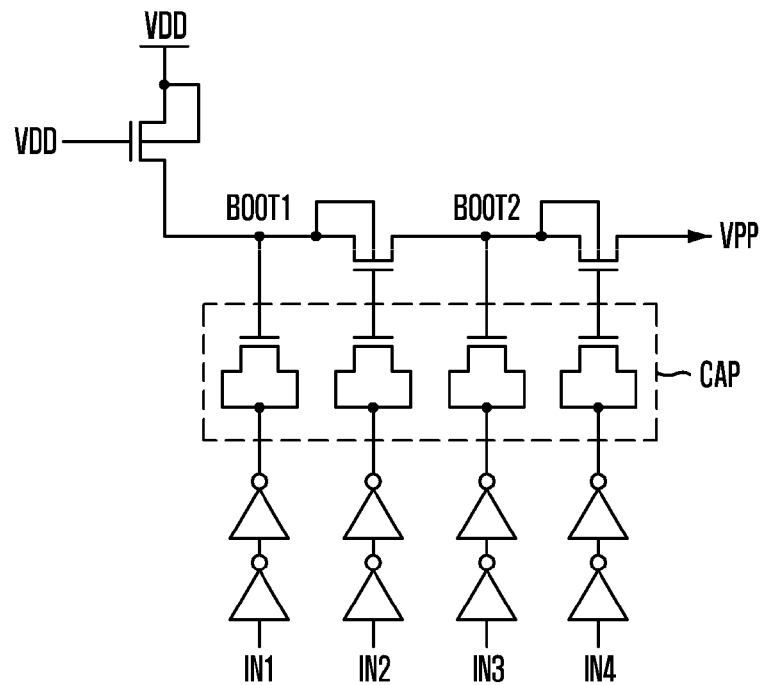
FIG. 1 is a general pumping voltage VPP generation circuit.
Figure 2:
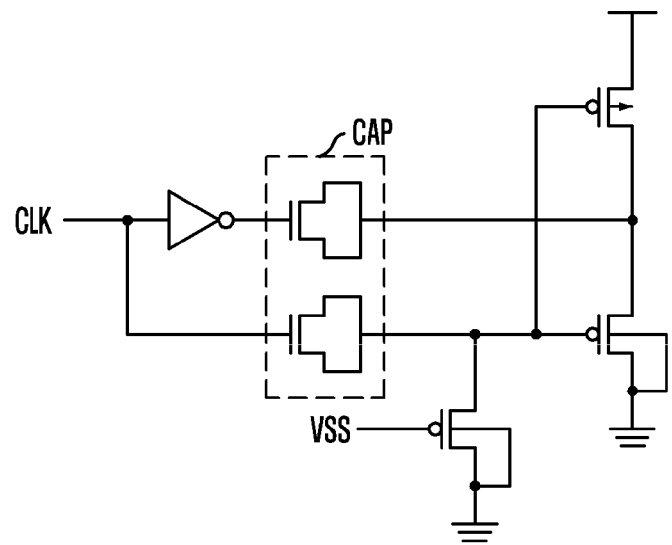
FIG. 2 is a general substrate bias voltage VBB generation circuit.
Figure 3:
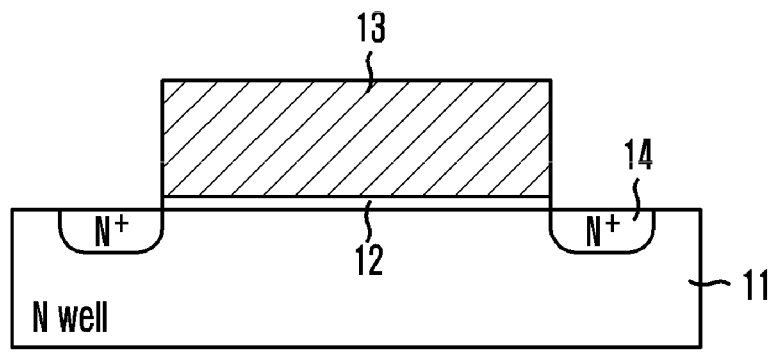
FIG. 3 is a cross-sectional view of a capacitor used for each of the pumping voltage VPP generation circuit and the substrate bias voltage VBB generation circuit according to the prior art.

Applying the capacitor in accordance with the first to third embodiments of the present invention as noted earlier to the pumping voltage VPP generation circuit as shown in FIG. 2, or to the substrate bias voltage VBB generation circuit as shown in FIG. 3 makes it possible to improve the pumping or decompressing capability of the generation circuits, without increasing an area of the generation circuits within a chip.

While the present invention has been described with respect to the particular embodiments that illustrate the methods for forming recess patterns, bulb patterns and fin patterns in order to form irregular patterns on the substrate, it may further employ saddle patterns where the fin patterns are formed on the bottom face of the recess patterns as another embodiment. Moreover, the present invention may use a combination of diverse types of patterns, as well as any other technique capable of forming irregular patterns on the substrate.

As described above, the present invention can improve capacitance by forming irregular patterns serving as one side electrode of a capacitor on a substrate to increase a junction area between electrodes, without an increase in an area of a capacitor within a chip. Accordingly, the present invention can increase the number of net dies, thereby enhancing yield of a semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A pumping MOS capacitor, comprising:
   a substrate including impurities;
   a dielectric film arranged along stepped portions formed on the substrate;
   a gate arranged on the dielectric film; and
   a source and a drain arranged in the substrate on two sides of the gate, respectively;
   wherein the source and the drain include impurities of the same conductive type as the impurities of the substrate and the stepped portions form any pattern selected from the group consisting of a recess pattern, a fin pattern, a saddle pattern, or a combination thereof and form a corrugated surface.

2. The pumping MOS capacitor as recited in claim 1, wherein the gate includes a corrugated surface having steps formed above the source and the drain.

3. The pumping MOS capacitor as recited in claim 1, wherein the substrate is conductive.

4. The pumping MOS capacitor as recited in claim 1, wherein the substrate is conductive due to the impurities.

5. The pumping MOS capacitor as recited in claim 4, wherein the impurities are N-type or P-type impurities.

6. The pumping MOS capacitor as recited in claim 1, wherein the gate comprises a conductive film.

* * * * *